United States Patent
Koseki

(10) Patent No.: US 7,474,246 B2
(45) Date of Patent: Jan. 6, 2009

(54) AD CONVERTER DEVICE, PHYSICAL QUANTITY DISTRIBUTION DETECTING UNIT AND IMAGING APPARATUS

(75) Inventor: Ken Koseki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/716,807

(22) Filed: Mar. 12, 2007

(65) Prior Publication Data

US 2007/0216564 A1 Sep. 20, 2007

(30) Foreign Application Priority Data

Mar. 14, 2006 (JP) .............................. P2006-068762

(51) Int. Cl.
*H03M 1/12* (2006.01)
(52) U.S. Cl. ..................... 341/155; 341/118; 341/158; 341/159
(58) Field of Classification Search ................. 341/155, 341/118, 158, 159, 166; 348/311
See application file for complete search history.

(56) References Cited

U.S. PATENT DOCUMENTS

| | | | | |
|---|---|---|---|---|
| 3,877,025 A | * | 4/1975 | Maio | 341/159 |
| 5,264,851 A | * | 11/1993 | Yasuda | 341/158 |
| 6,166,367 A | * | 12/2000 | Cho | 250/208.1 |
| 6,204,795 B1 | * | 3/2001 | Afghahi | 341/166 |
| 6,369,743 B2 | * | 4/2002 | Ono | 341/159 |
| 6,518,898 B1 | * | 2/2003 | Choksi | 341/118 |
| 6,831,586 B2 | * | 12/2004 | Jansson | 341/158 |
| 2003/0016149 A1 | * | 1/2003 | Choksi | 341/118 |
| 2003/0048213 A1 | * | 3/2003 | Sushihara et al. | 341/159 |
| 2005/0231624 A1 | * | 10/2005 | Muramatsu | 348/311 |
| 2006/0097902 A1 | | 5/2006 | Muramatsu et al. | |

FOREIGN PATENT DOCUMENTS

JP 2005-323331 11/2005

* cited by examiner

*Primary Examiner*—Jean B Jeanglaude
(74) *Attorney, Agent, or Firm*—Rockey, Depke & Lyons, LLC; Robert J. Depke

(57) ABSTRACT

An AD converter device is provided. In the AD converter device, a plurality of differential comparators operable to compare an analog signal with a slope like reference signal is arranged, and with reference to a comparison output of the plurality of the differential comparators, the analog signal is converted in direction of time base to measure time period, whereby a digital signal is obtained. The AD converter device includes a voltage applying module operable to apply a voltage signal in the same waveform as that of the reference signal alternately to a back gate terminal of differential pair transistors of the differential comparator.

11 Claims, 15 Drawing Sheets

AD CONVERTER DEVICE, PHYSICAL QUANTITY DISTRIBUTION DETECTING UNIT AND IMAGING APPARATUS

CROSS REFERENCES TO RELATED APPLICATIONS

The present invention contains subject matter related to Japanese Patent Application JP 2006-068762 filed in the Japanese Patent Office on Mar. 14, 2006, the entire contents of which being incorporated herein by reference.

BACKGROUND OF THE INVENTION

1. Field of the Invention

The present invention relates to an AD (analog-digital) converter, a physical quantity distribution detecting unit, and an imaging apparatus.

2. Description of the Related Art

For a physical quantity distribution detecting unit which detects the distribution of physical quantity, for example, there is a solid state imaging device which has unit pixels (unit sensors) two dimensionally arranged in a matrix, the unit pixel including a photoelectric conversion element which detects the light quantity of incident light. The solid state imaging device is roughly classified into an electric charge transfer solid state imaging device typified by a CCD (Charge Coupled Device) image sensor and an X-Y addressing solid state imaging device typified by a CMOS (Complementary Metal Oxide Semiconductor) image sensor.

In recent years, instead of the CCD image sensor which has been the mainstream before, attention is focused on the CMOS image sensor. This is because the CMOS image sensor overcomes various problems of the CCD image sensor, for example, the necessity of special processes for fabrication, the necessity of a plurality of power supply voltages for operation, and the necessity of combining a plurality of peripheral ICs for operation, leading to a very complicated system.

The CMOS image sensor has huge merits, for example, the same fabrication processes can be used as those for a typical CMOS integrated circuit that is produced all over the world, the CMOS image sensor can be driven by a single power source, and an analog circuit and a logic circuit using the CMOS processes can be mounted on the same chip to reduce the number of peripheral ICs.

In the CCD image sensor, its output circuit mainly uses a single channel output using an FD (Floating Diffusion) amplifier. However, the CMOS image sensor has an FD amplifier for every pixel, its output is mainly column parallel output in which pixels are two dimensionally arranged in a matrix to form a pixel array part, a certain row in the pixel array part is selected and the row is read at the same time in the column direction. This is because it is difficult to obtain sufficient drive performance by the FD amplifier arranged in the pixel, it is thus necessary to drop the data rate, and it is considered that parallel processing is advantageous.

For the signal output circuit of the parallel output CMOS image sensor, various configurations are designed. For one of the most cutting edge forms, a CMOS image sensor is known which is mounted with a column parallel AD converter device in which an AD converter is arranged for every column to take out a pixel signal as a digital signal (for example, see JP-A-2005-323331 (Patent Reference 1)).

In the CMOS image sensor mounted with the column parallel AD converter device, for the AD converter to be arranged at every column, such an AD converter is used in which an analog signal obtained from a unit pixel at every selected row through a column signal line is compared with a ramp wave reference voltage Vref by a comparator to convert the analog signal in the direction of the time base, and the time period is measured to convert the analog signal into a digital signal.

Here, in the CMOS image sensor mounted with the column parallel AD converter device, the comparator for use in the AD converter arranged at every column is considered.

FIG. 9 shows a typical circuit diagram depicting a two-input comparator. As shown in FIG. 9, the comparator is a differential amplifier comparator configured of differential pair transistors 101 and 102, active load transistors 103 and 104, and a constant current source transistor 105.

In the differential amplifier comparator, each of the gate terminals of the differential pair transistors 101 and 102 are an input terminal, and to the input terminal, a reference voltage Vref and a signal voltage Vx are inputted. The drain terminal of the transistor 101 in the differential pair transistors 101 and 102 is the output terminal of the comparator.

Generally, in the differential amplifier comparator, the polarity of output is reversed at the point at which the input voltage is crossed, but it is normal that the comparator has offset voltage at the crossing point due to variations in the transistor characteristics.

FIG. 10 shows the current characteristics of a typical transistor. In the typical transistor, a current Ids with square characteristics flows out from the point at which a gate-source voltage Vgs exceeds the threshold voltage. When there are variations in the transistor characteristics, the flowing currents have differences even though the same bias voltage is applied as indicated by characteristics S11 and S12. It is assumed that the transistor is unchanged and used as the differential pair transistors 101 and 102 for the comparator. Even though the same input voltage is reached, the polarity is not reversed as the comparator because the current characteristics have differences, the current value is not the same until a certain voltage difference appears, and then the polarity can be reversed as the comparator. The voltage difference necessary for the reversal is a so-called input voltage offset, which exits in any differential amplifiers more or less.

Heretofore, in the CMOS image sensor mounted with the column parallel AD converter device, a scheme is made so that the offset of the comparator does not directly lead to the error of AD conversion accuracy. More specifically, AD conversion is performed twice, at a first time and a second time, and a subtraction process is finally performed for CDS (Correlated Double Sampling), whereby the error components similarly occurring at the first time and the second time are cancelled for complete removal. Therefore, when the offset of the comparator occurs by the same amount at the first time and the second time, the offset is completely cancelled by the subtraction process, causing no problem.

A problem for considering the precondition is the back bias effect of a transistor. In the conversion at the first time, the range that the signal possibly takes is considerably limited since the reset level of the unit pixel is read, but in the conversion at the second time, the range that the signal possibly takes is wide since the signal depending on the incident light quantity is read, and the value can be taken that is separated from the value at the first time.

FIG. 11 shows the outline of the operation. Since the ranges that the signal possibly takes are different in the conversions at the first time and the second time, the reverse points (common mode voltage) are greatly different as the comparator.

Returning to FIG. 10, this situation is considered in the current characteristics. Since the back gate of the differential pair transistors 101 and 102 is grounded, the difference of input voltage directly appears as the back bias effect.

The threshold voltage of the transistor is greatly changed due to the back bias effect. As indicated by the characteristics S11 and S12, when the transistor characteristics have variations, variations naturally occur in the way to apply the back bias effect. Consequently, the offset of the comparator voltage in the conversions at the first time and the second time is to vary. This is a huge problem because it directly affects the AD conversion characteristics.

Since the comparator is common for the pixel for every column, the problem appears as the conversion error in vertical streaks depending on the brightness in an image. Particularly, it becomes the conversion error in vertical streaks depending on the incident light quantity (output signal amount). The vertical streaks are categorized as conspicuous ones as error. Since the vertical streaks occur depending on the output signal amount, it is difficult to correct the streaks by digital signal processing, which are a huge problem.

SUMMARY OF THE INVENTION

Generally, in order to ignore the back bias effect, a form of a differential amplifier as shown in FIG. 12 is used. The difference from the one shown in FIG. 9 is in that the back gates (well) of differential pair transistors 111 and 112 are connected to a source terminal. When the back gate of the differential pair transistors 111 and 112 is connected to the source terminal, the back bias effect will not occur even though the bias voltage of the gate is varied. However, when the layout efficiency is considered, this scheme is extremely ineffective having a problem to adopt.

Before the layout of the comparator is described, the pixel structure of the unit pixel will be described with reference to FIG. 13. In the pixel structure, the structure of an N type semiconductor substrate 201 and a P well 202 is adopted in which a photodiode 204 is formed by the NP junction of an N-impurity diffusion area 203 and the P well 202. On the substrate front surface side of the photodiode 204, a hole storage layer 205 is formed in order to increase sensitivity and to reduce dark current.

In the pixel structure, the signal electric charge photoelectrically converted by the photodiode 204 is stored in the N-impurity diffusion area 203. The stored signal electric charge is transferred to a FD (floating diffusion) part 207 through a channel below a gate electrode 206 of a transfer transistor, and it is converted into an electric signal in the FD part 207 for readout.

Here, a great enemy to the pixel is the occurrence of dark current. In order to suppress the occurrence of dark current as much as possible, it is effective to provide the N-type substrate 201 below the P well 202. Therefore, the well in well structure using an N-sub (N-type substrate) wafer is the most desirable in design.

FIGS. 14A and 14B show the outline when a differential input part of the comparator shown in FIG. 9 is laid out on a semiconductor having the N-sub well in well structure.

In FIGS. 14A and 14B, 301 denotes an N-type substrate, 302 denotes a P well, 303 denotes a substrate contact which applies a GND voltage to the P well 302, 304 denotes an active region of a transistor, 305 denotes a gate electrode of the transistor, 306 denotes a substrate contact which takes out the source and the drain, and 307 denotes a device separation area.

In the case of the CMOS image sensor mounted with the column parallel AD converter device in which the signal of the unit pixel is read in column parallel, a read circuit is regularly arranged by the number of columns as matched with the pixel pitch (the distance between the unit pixels). In recent years, the pixel pitch is increasingly decreased in size, and in the cutting edge circuit, the pixel pitch is about 2 µm. Therefore, an extremely effective layout is necessary to arrange circuits in such a layout.

FIGS. 15A and 15B show the outline when the circuit shown in FIG. 12 is laid out. In FIGS. 15A and 15B, the same numerals and signs are assigned to the equivalent portions as those shown in FIGS. 14A and 14B. In order to ignore the back bias effect, the P well is connected to the source terminal of the transistor, but it is necessary to separate it from the source terminal of the transistor in the adjacent column, and then the P well 302 is separated at every column.

However, in the N-substrate well in well structure, in order to separate the P well 302, it is necessary to expose the N-type substrate 301 up to the front surface as shown in FIGS. 15A and 15B. Therefore, as apparent from FIGS. 15A and 15B, the layout is extremely ineffective when the differential input part of the comparator is laid out.

Thus, it is desirable to provide an AD converter device in which a comparator for use in a plurality of AD converters has a typical, simple differential amplifier structure with high layout efficiency but does not suffer from back bias effect, a physical quantity distribution detecting unit mounted with the AD converter device, and an imaging apparatus.

An embodiment of the invention adapts the configuration of an AD converter device in which a plurality of differential comparators operable to compare an analog signal with a slope like reference signal is arranged, wherein with reference to a comparison output of the plurality of the differential comparators, the analog signal is converted in direction of time base to measure time period, whereby a digital signal is obtained by measurement of the time, in the AD converter device, a voltage signal in the same waveform as that of the reference signal is alternately applied to a back gate terminal of differential pair transistors of the differential comparator.

In the AD converter device in the configuration, the signal voltage in the same waveform as that of the reference signal is alternately applied to the back gate terminal of the differential pair transistors, whereby the voltage of the back gate of the differential pair transistors is varied together with the gate voltage of the transistor on the side on which the reference voltage is inputted. Therefore, not depending on the DC voltage at the reverse point of the comparator, the difference between the gate voltage and the back gate voltage is constant. Accordingly, even though the comparator is reversed at any points, the back bias effect does not have influence.

According to an embodiment of the invention, since the back bias effect does not have influence, no AD conversion error occurs. In addition to this, since it is unnecessary to connect the back gate terminal of the differential pair transistors to the source terminal, high layout efficiency can be provided.

DETAILED DESCRIPTION OF THE INVENTION

Hereinafter, embodiments of the invention will be described in detail with reference to the drawings.

Figure 1:
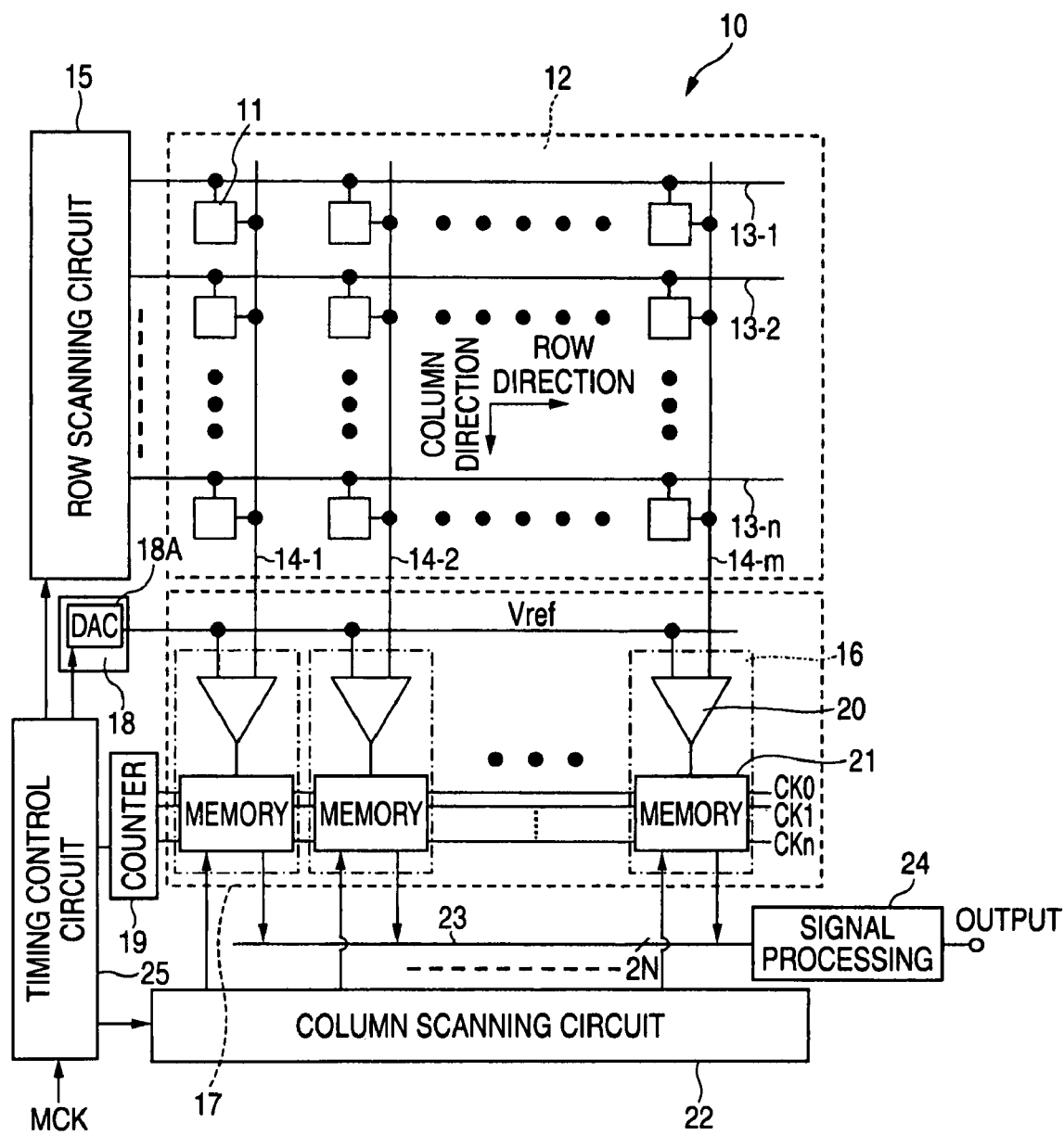
FIG. 1 shows a block diagram depicting the configuration of a CMOS image sensor mounted with a column parallel AD converter device to which an embodiment of the invention is adapted.

FIG. 1 shows a block diagram depicting the configuration of a physical quantity detecting unit to which an embodiment of the invention is adapted, for example, a CMOS image sensor 10 mounted with a column parallel AD converter device.

In FIG. 1, a unit pixel 11 has a photodiode and an amplifier in the pixel, and the unit pixels are two dimensionally arranged in a matrix to configure a pixel array part 12. In the pixel arrangement of the pixel array part 12 in n rows and m columns, a row control line 13 (13-1, 13-2 . . . , 13-n) is wired for every row, and a column signal line 14 (14-1, 14-2 . . . , 14-m) is wired for every column. Control over the row addressing and row scanning of the pixel array part 12 is performed by a row scanning circuit 15 through the row control lines 13-1, 13-2, . . . , 13-n.

On one end side of the column signal lines 14-1, 14-2, . . . , 14-m, an AD converter (hereinafter, denoted as "ADC") 16 is arranged at each of the column signal lines 14-1, 14-2, . . . , 14-m to configure a column processing part (column parallel ADC block) 17. In addition, each of the ADCs 16 is provided with a ramp wave generator circuit 18 which generates a reference voltage Vref in a ramp waveform (slope like waveform), and a counter 19 which performs count operation in synchronization with a clock CK in a predetermined cycle to measure a time period for the comparison operation by a comparator 20, described later. For example, the ramp wave generator circuit 18 is configured using a digital-analog converter (hereinafter, abbreviated to DAC (Digital-Analog Converter)) 18A.

The ADC 16 is formed of the comparator 20 which compares an analog signal obtained from the unit pixels 11 in the selected row through the column signal lines 14-1, 14-2, . . . , 14-m with the reference voltage Vref generated in the DAC 18A for each of the row control lines 13-1, 13-2, . . . , 13-n, and a memory device 21 which stores the count value of the counter 19 in response to the comparison output of the comparator 20, having a function that converts the analog signal supplied from the unit pixel 11 into N bits of a digital signal.

Control over the column addressing and column scanning of each of the ADCs 16 of the column processing part 17 is performed by a column scanning circuit 22. In other words, N bits of the digital signal converted by each of the ADCs 16 are sequentially read by column scanning done by the column scanning circuit 22 to a horizontal output line 23 in 2N bit width, and are transmitted by the horizontal output line 23 to a signal processing circuit 24. The signal processing circuit 24 is configured of 2N circuits of sense circuits which correspond to the horizontal output line 23 in 2N bit width, a subtraction circuit, an output circuit, etc.

A timing control circuit 25 generates a clock signal and a timing signal necessary for the operations of the row scanning circuit 15, the ADC 16, the ramp wave generator circuit 18, the counter 19, and the column scanning circuit 22 based on a master clock MCK, and supplies the clock signal and the timing signal to the corresponding circuit part.

Figure 2:
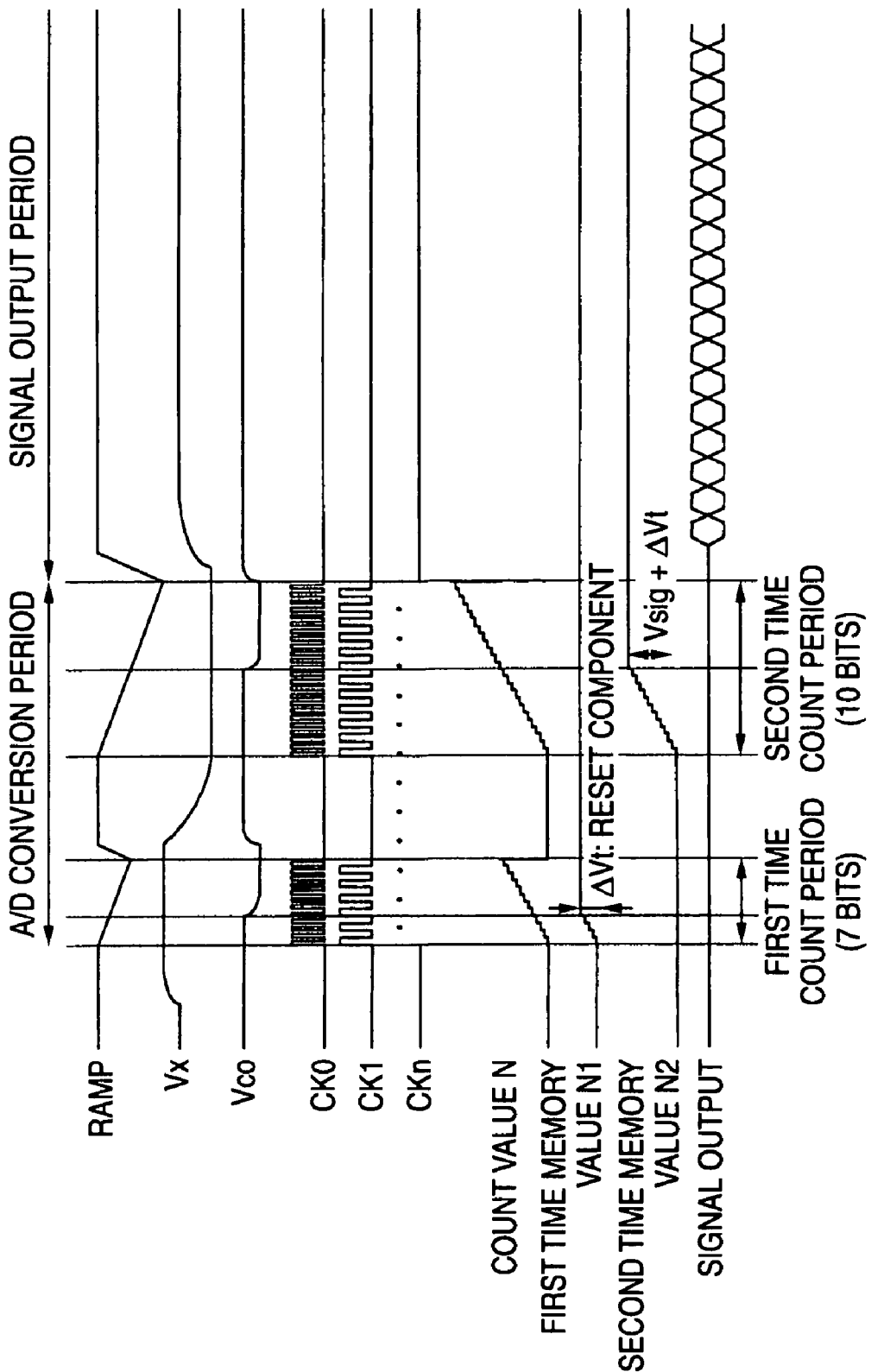
FIG. 2 shows a timing chart illustrative of the operation of the CMOS image sensor mounted with the column parallel AD converter device.

Next, the operation of the CMOS image sensor 10 mounted with the column parallel AD converter device in the configuration will be described with reference to a timing chart shown in FIG. 2.

After the read operation at the first time from a certain unit pixel 11 in the selected row to the column signal lines 14-1, 14-2, . . . , 14-m is stabilized, the ramp wave reference voltage Vref is supplied from the DAC 18A to the comparator 20, whereby the comparison operation of a signal voltage Vx of the column signal lines 14-1, 14-2, . . . , 14-m with the reference voltage Vref is performed in the comparator 20. In the comparison operation, when the reference voltage Vref becomes equal to the signal voltage Vx, the polarity of the comparison output Vco of the comparator 20 is reversed. The memory device 21 receives the reverse output of the comparator 20, and then stores a count value N1 of the counter 19 as matched with the comparison period in the comparator 20.

In the read operation at the first time, a reset component ΔVt of the unit pixel 11 is read. The reset component ΔVt contains fixed pattern noise which varies in every unit pixel 11 as an offset. However, since the variations in the reset component ΔVt are generally small and the reset level is common for all the pixels, the signal voltage Vx of the column signal line 14 in readout at the first time is almost known. Therefore, in the readout of the reset component ΔVt at the first time, the ramp wave reference voltage Vref is adjusted to shorten the comparison period in the comparator 20. In the conventional implementation, the reset component ΔVt is compared in a seven bit count period (128 clocks).

In the readout at the second time, in addition to the reset component ΔVt, the signal component corresponding to the incident light quantity is read for every unit pixel 11 by the similar operation as the readout at the first time. In other words, after the read operation at the second time from a certain unit pixel 11 in the selected row to the column signal lines 14-1, 14-2, . . . , 14-m is stabilized, the ramp wave reference voltage Vref is supplied from the DAC 18A to the comparator 20, whereby the comparison operation of the signal voltage Vx of the column signal lines 14-1, 14-2, ..., 14-m with the reference voltage Vref is performed in the comparator 20.

Upon the reference voltage Vref being supplied to the comparator 20, the counter 19 counts at the second time. In the comparison operation at the second time, when the reference voltage Vref becomes equal to the signal voltage Vx, the polarity of the comparison output Vco of the comparator 20 is reversed. The memory device 21 receives the reverse output of the comparator 20, and then stores a count value N2 of the counter 19 as matched with the comparison period in the comparator 20. At this time, the count value N1 at the first time and the count value N2 at the second time are stored in the different places in the memory device 21.

After a sequence of the AD conversion operation, N bits of the digital signals at the first time and the second time stored in the memory device 21 are supplied by column scanning done by the column scanning circuit 22 to the signal processing circuit 24 through 2N lines of the horizontal output lines 23. In a subtraction circuit (not shown) inside the signal processing circuit 24, the subtraction process (the signal at the second time)–(the signal at the first time), that is, the subtraction process for CDS is performed, and then the signal is outputted to outside. After that, the same operation is sequentially repeated for every row to create a two dimensional image.

In an embodiment of the invention, the characteristic configuration is the configuration of the AD converter device in which in the CMOS image sensor 10 mounted with the column parallel AD converter device described above, the analog signal obtained from the unit pixel 11 through the column signal lines 14-1, 14-2, ..., 14-m is compared with the slope like reference voltage Vref for each of the row control lines 13-1, 13-2, ..., 13-n, and the analog signal is converted in the direction of the time base to measure the time, whereby the digital signal is obtained.

First Embodiment

Figure 3:
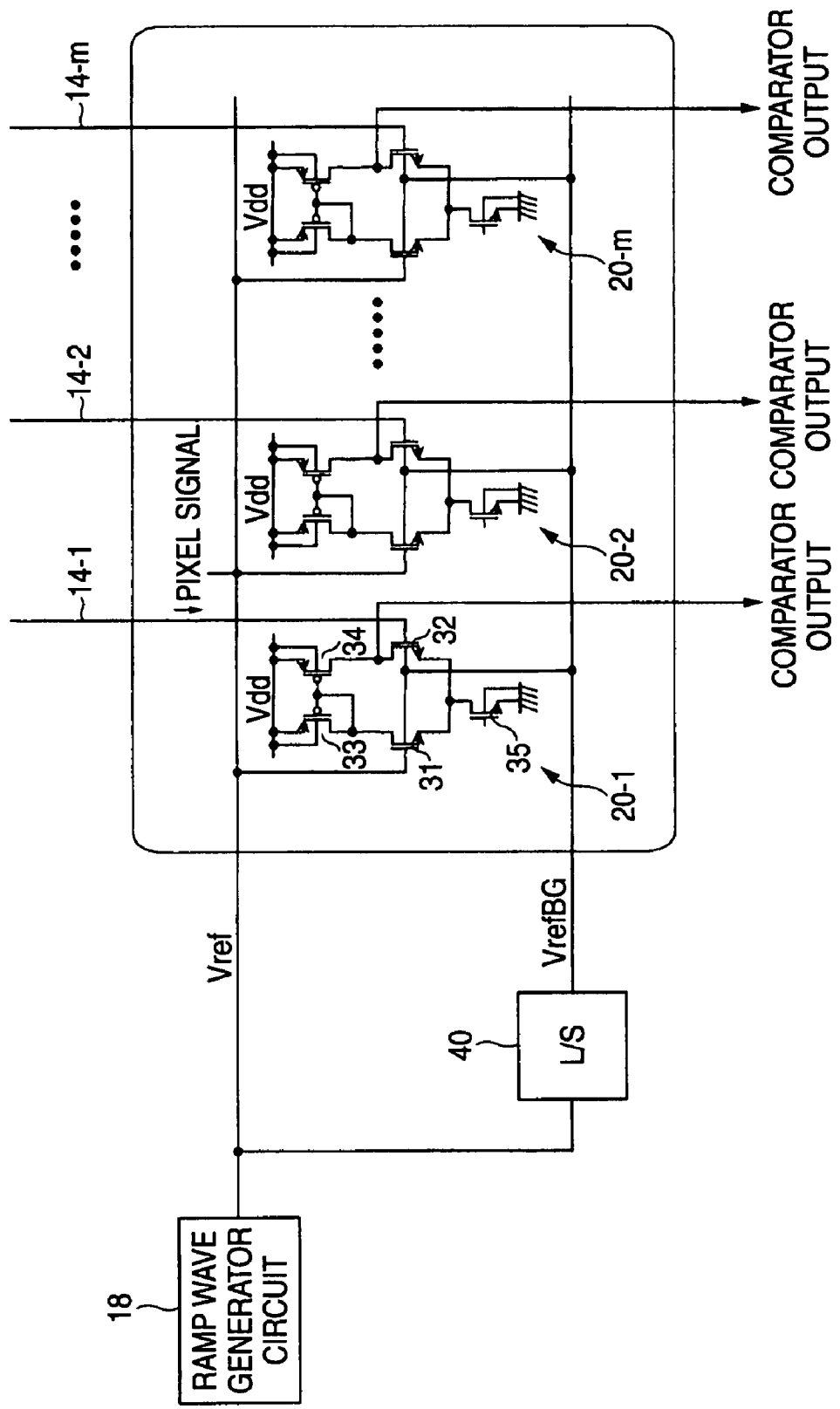
FIG. 3 shows a circuit diagram depicting the configuration of an AD converter device according to a first embodiment of the invention.

FIG. 3 shows a circuit diagram depicting an exemplary configuration of the portion of a comparator of an AD converter device according to a first embodiment of the invention.

As shown in FIG. 3, the AD converter device according to the embodiment is configured to have comparators 20 (20-1, 20-2, ..., 20-m) arranged by the number of pixel columns, for example, as matched with the pixel pitch (the distance in the row direction of the unit pixels 11) with respect to column signal lines 14-1, 14-2, ..., 14-m, that is, in the one to one correspondence. For the comparators 20-1, 20-2, ..., 20-m, a differential amplifier comparator (differential comparator) is used.

More specifically, the comparators 20-1, 20-2, ..., 20-m are each configured of differential pair transistors 31 and 32 which have a source terminal connected in common to perform the differential operation, active load transistors 33 and 34 which are connected between the drain terminal and the first power source of the differential pair transistors 31 and 32 (for example, a power source Vdd) and have the gate terminal connected in common with each other, and a constant current source transistor 35 which is connected between the source common connecting node and the second power source of the differential pair transistors 31 and 32 (for example, a ground). The active load transistor 33 is in the diode connecting configuration in which the gate terminal and the drain terminal are connected in common.

In the AD converter device having the differential amplifier comparators 20-1, 20-2, ..., 20-m, the ramp wave (slope like) reference voltage Vref from a ramp wave generator circuit 18 is applied to the gate terminal of one (31) of the differential pair transistors 31 and 32 in common, and the analog signal (pixel signal) is applied from each of the unit pixels 11 to the gate terminal of the other (32) through the column signal lines 14-1, 14-2, ..., 14-m.

The back gate of the differential pair transistors 31 and 32 is taken as a single, independent node (terminal). The node is not separated at every column, that is, at each of the comparators 20-1, 20-2, ..., 20-m, which is a single node (well) in common among the comparators 20-1, 20-2, ..., 20-m.

To the back gate terminal of the differential pair transistors 31 and 32, a back gate voltage VrefBG in the same waveform as that of the ramp wave reference voltage Vref is applied alternately at least during an AD conversion period. For example, the back gate voltage VrefBG is generated in such a way that a level shift (L/S) circuit 40 is used to level shift the ramp wave reference voltage Vref on the low potential side in a direct current manner. The level shift circuit 40 corresponds to a voltage applying module.

Figure 4:
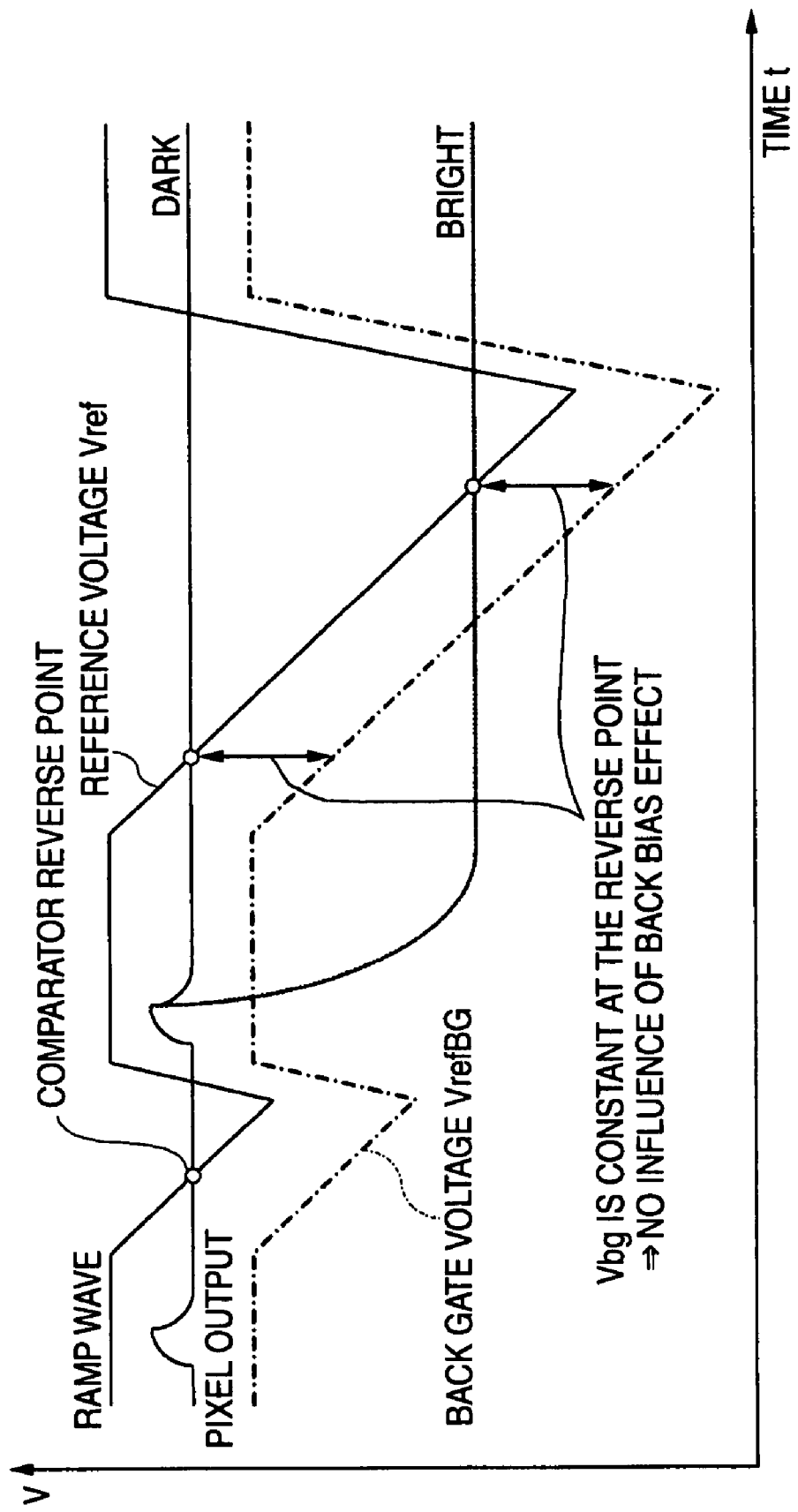
FIG. 4 shows a waveform diagram illustrative of the principle of the operation the AD converter device according to the first embodiment.

Next, the principle of the operation of the comparator 20 (20-1, 20-2, ..., 20-m) in the AD converter device in the configuration described above according to the embodiment will be described with reference to a waveform diagram shown in FIG. 4.

The ramp wave reference voltage Vref is inputted to one of the differential inputs of the comparator 20, that is, to the gate terminal of the transistor 31 of the differential pair transistors 31 and 32, the pixel signal is inputted from the unit pixel 11 to the other of the differential inputs of the comparator 20, that is, to the gate terminal of the other transistor 32 of the differential pair transistors 31 and 32, and the back gate voltage VrefBG in the same waveform as that of the reference voltage Vref is alternately applied to the back gate terminal of the both transistors.

At the point at which the comparator 20 is reversed, the differential input voltage is of the same voltage value when the offset voltage is ignored. Here, as described above, when the relation between the gate voltage and the back gate voltage (well voltage) at the reverse point is changed, the offset voltage might be changed as well due to the influence of the back bias effect.

On the other hand, in the AD converter device according to the embodiment, the back gate voltage VrefBG in the same waveform as that of the reference voltage Vref is alternately applied to the back gate of the differential pair transistors 31 and 32, whereby the voltage of the back gate of the differential pair transistors 31 and 32 is varied together with the gate voltage of the transistor 31 on the side on which the reference voltage Vref is inputted. Thus, a difference Vgb between the gate voltage and the back gate voltage is constant, not depending on the DC voltage at the reverse point of the comparator 20. Accordingly, even though the comparator 20 is reversed at any point, the back bias effect does not have influence, and thus no AD conversion error occurs.

Figure 5:
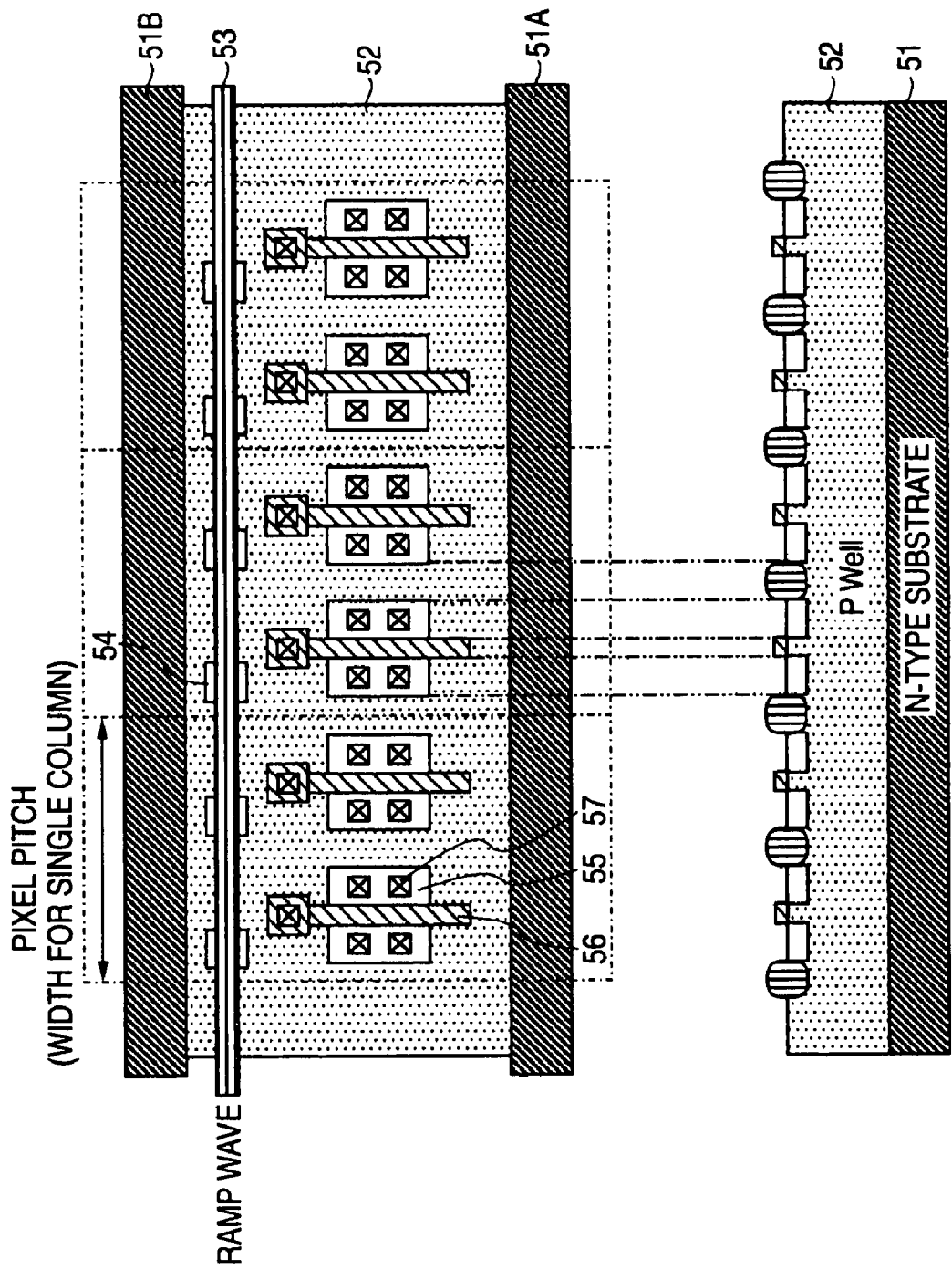
FIG. 5 shows a diagram depicting the outline of the layout of the AD converter device according to the first embodiment.

FIG. 5 shows the outline of the layout of the differential input part of the comparator 20 in the AD converter device according to the embodiment.

Figures 15A, 15B:
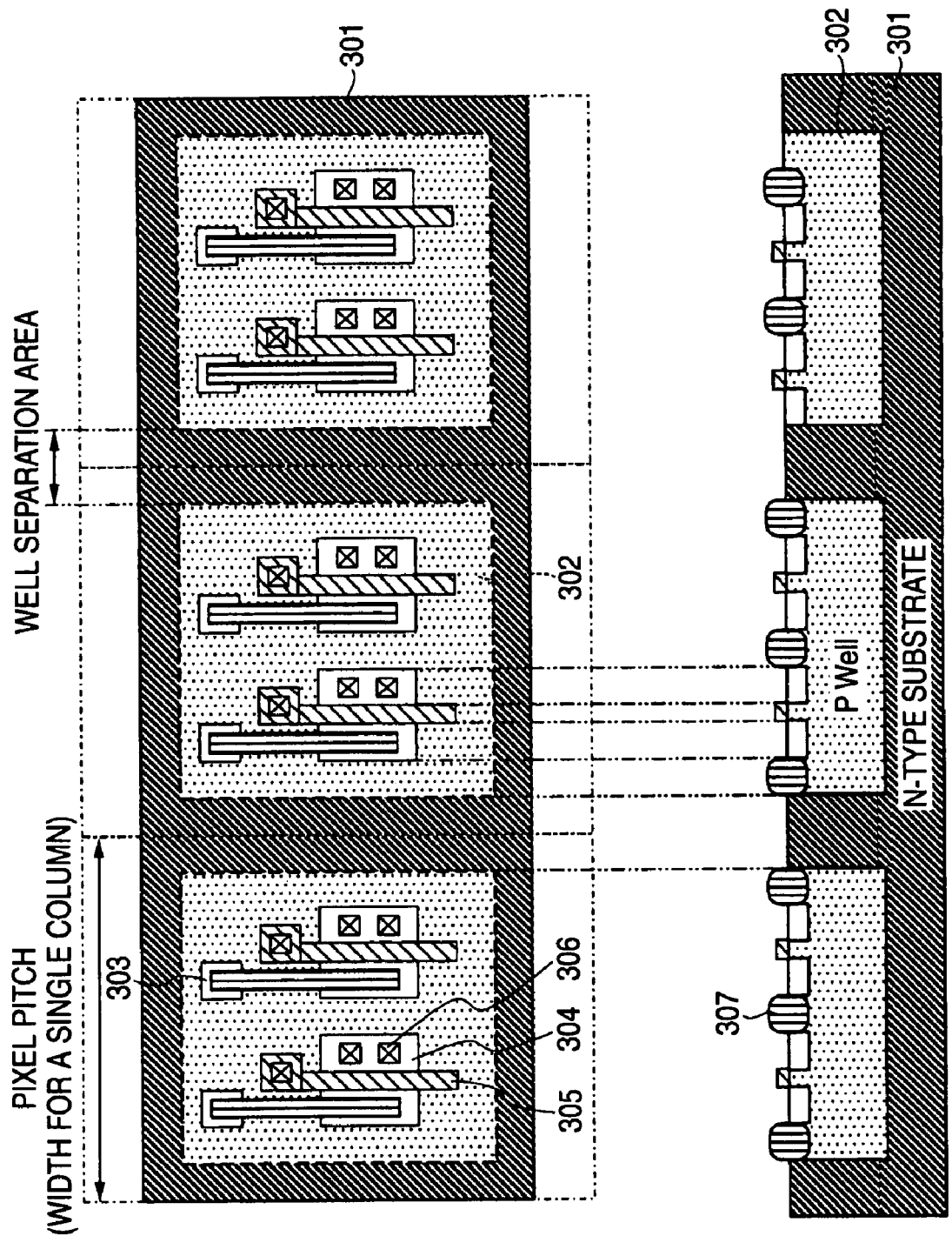
FIGS. 15A and 15B show diagrams depicting the outline when the comparator in the differential amplifier form is laid out in order to ignore the back bias effect.

In FIG. 5, since a P well 52 on an N-type substrate 51 is not dropped to the ground (GND), it is necessary to isolate the Well from the other transistors, for example, the constant current source transistor 35 shown in FIG. 3. However, since it is not isolated independently from every column, as shown in FIGS. 15A and 15B, it is unnecessary to vertically expose the N-type substrate 51 in the area in which the pixel pitch is formed, and it is sufficient that the pixel pitch is transversely passed through N-type substrate areas 51A and 51B one by one. Therefore, without being restricted by the pixel pitch, the layout area is widened more or less vertically, which causes almost no problem of an area increase as a whole chip.

Figures 14A, 14B:
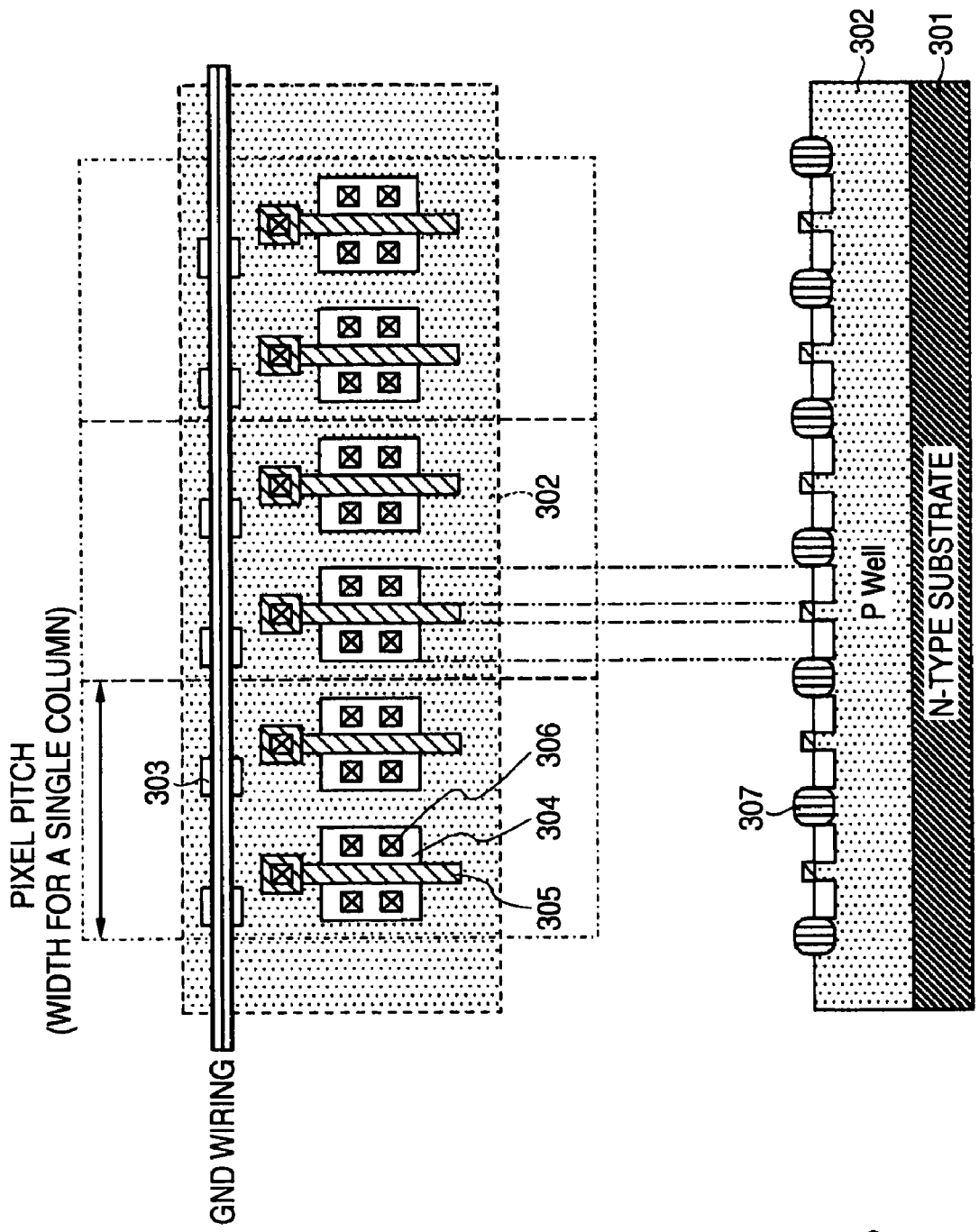
FIGS. 14A and 14B show diagrams depicting the outline when the differential input part of a typical comparator is laid out on the semiconductor having the N-sub well in well structure.

For the potential of the isolated P well 52, the back gate voltage VrefBG in the same waveform as that of the ramp wave reference voltage Vref is alternately supplied. Since the resistance of the P well 52 is relatively high, the voltage is supplied through a low resistance wiring 53 formed for example of metal, and a large number of substrate contacts 54 are provided. Accordingly, the back gate voltage VrefBG can be supplied to the reference voltage Vref with no delay as the potential of the P well 52. Even though the low resistance wiring 53 is wired and a large number of the substrate contacts 54 are provided, the configuration is not different from the configuration before shown in FIGS. 14A and 14B, which causes no area problem particularly.

Moreover, in FIG. 5, 55 denotes active region of the differential pair transistors 31 and 32, 56 denotes the gate electrode of differential pair transistors 31 and 32, and 57 denotes a substrate contact which takes out the source and the drain.

As described above, the configuration is adopted in which in the AD converter device having a plurality of the differential amplifier comparators (differential comparators) which compare the analog signal obtained from the unit pixel 11 through the column signal lines 14-1, 14-2, . . . , 14-m with the ramp wave (slope like) reference voltage Vref, wherein with reference to the comparison output of the plurality of the comparators 20 (20-1, 20-2, . . . , 20-m), the analog signal is converted in the direction of the time base to measure the time period to obtain a digital signal, the back gate voltage VrefBG in the same waveform as that of the ramp wave reference voltage Vref is alternately applied to the back gate of the differential pair transistors 31 and 32 configuring the comparator 20 (20-1, 20-2, . . . , 20-m). With this configuration, the back bias effect does not have influence while the comparator 20 has a typical, simple differential amplifier structure, and it is unnecessary to connect the back gate terminal of the differential pair transistors 31 and 32 to the source terminal, which provides high layout efficiency as well.

Second Embodiment

Figure 6:
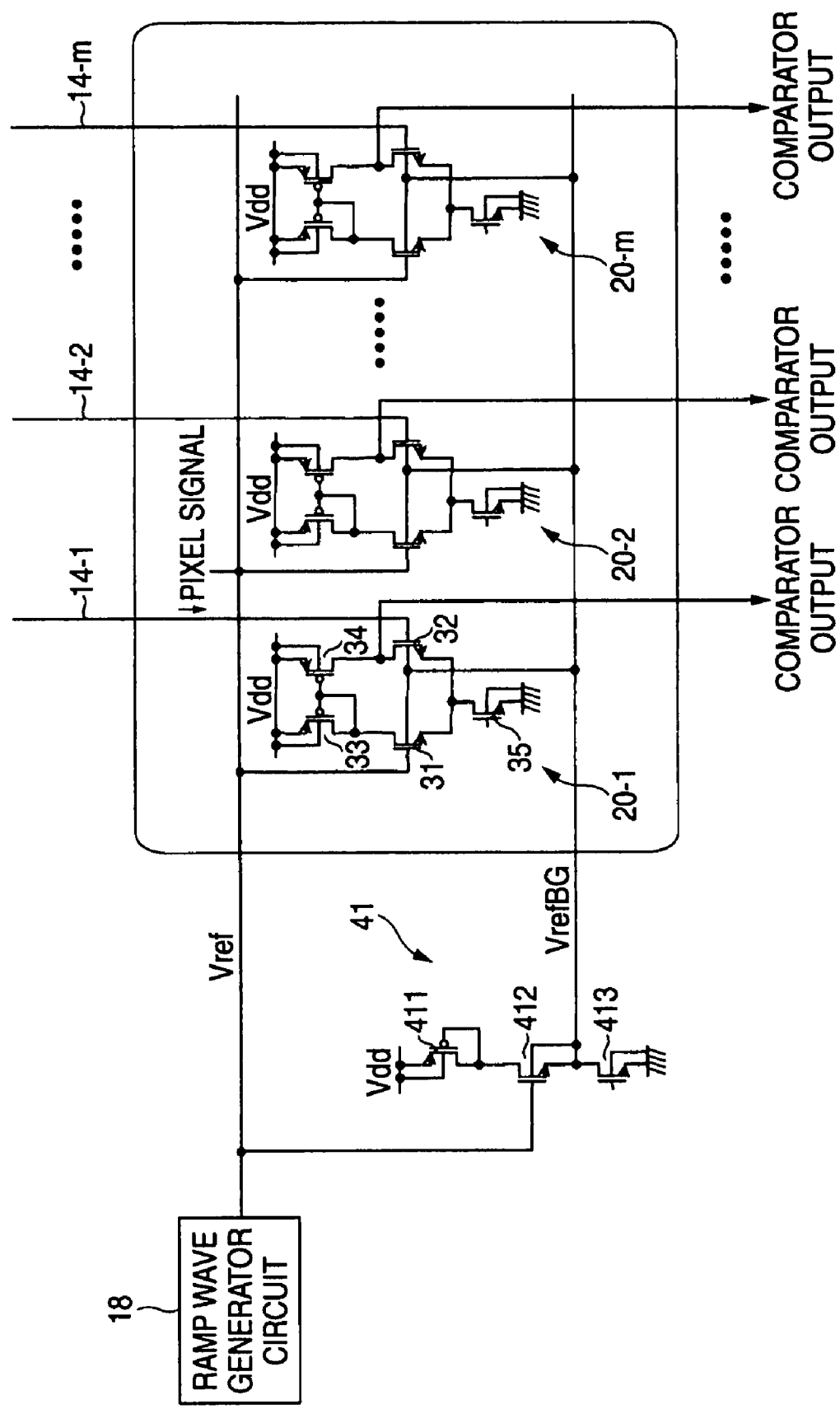
FIG. 6 shows a circuit diagram depicting the configuration of an AD converter device according to a second embodiment of the invention.

FIG. 6 shows a circuit diagram depicting an exemplary configuration of the portion of a comparator of an AD converter device according to the second embodiment. In the drawing, the same numerals and signs are assigned to the equivalent portions as those shown in FIG. 3. The AD converter device according to the embodiment is characterized in that the level shift circuit 40 of the AD converter device according to the first embodiment is more concrete.

Figure 12:
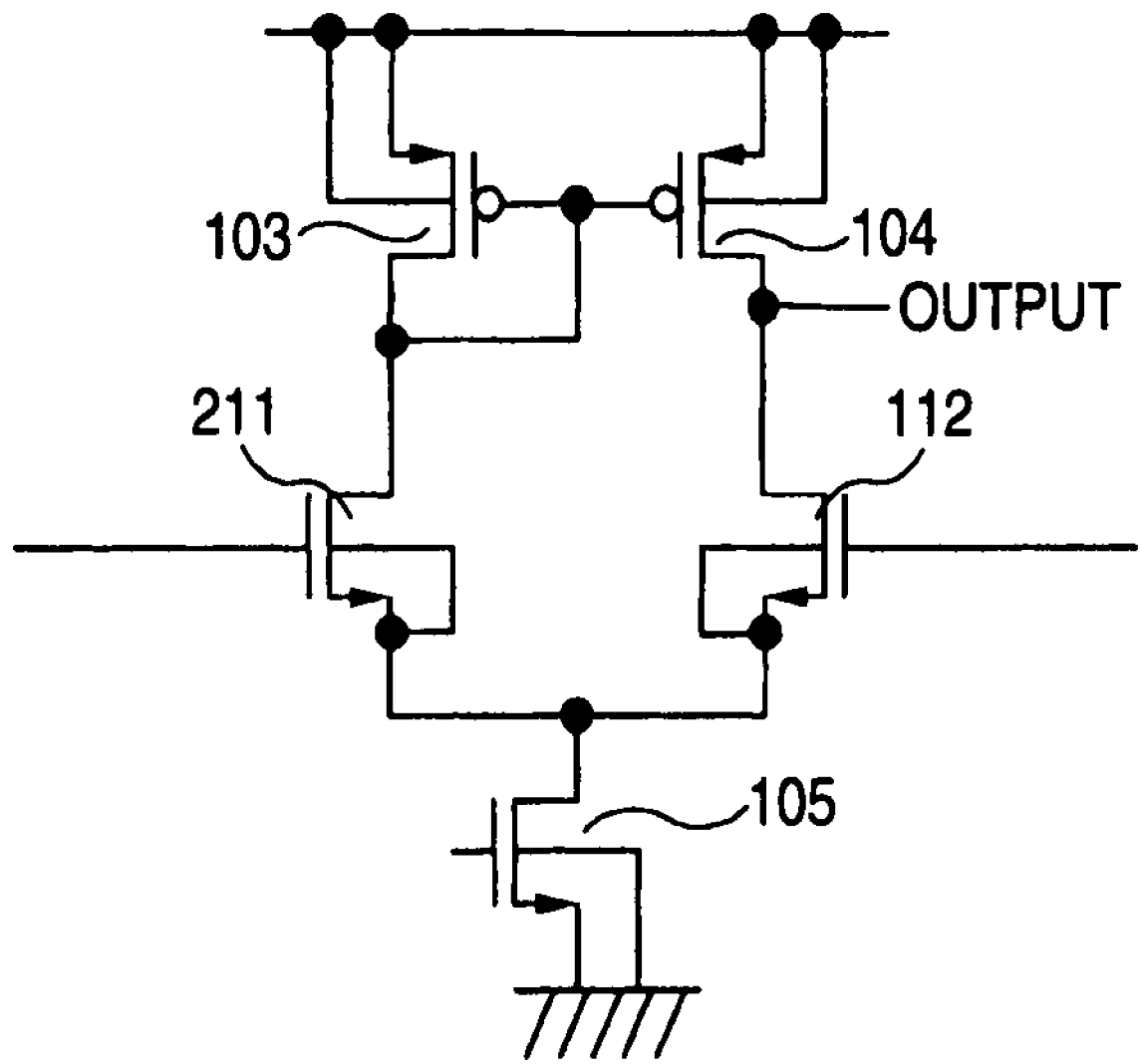
FIG. 12 shows a circuit diagram depicting the comparator in the differential amplifier form in order to ignore the back bias effect.
Figure 13:
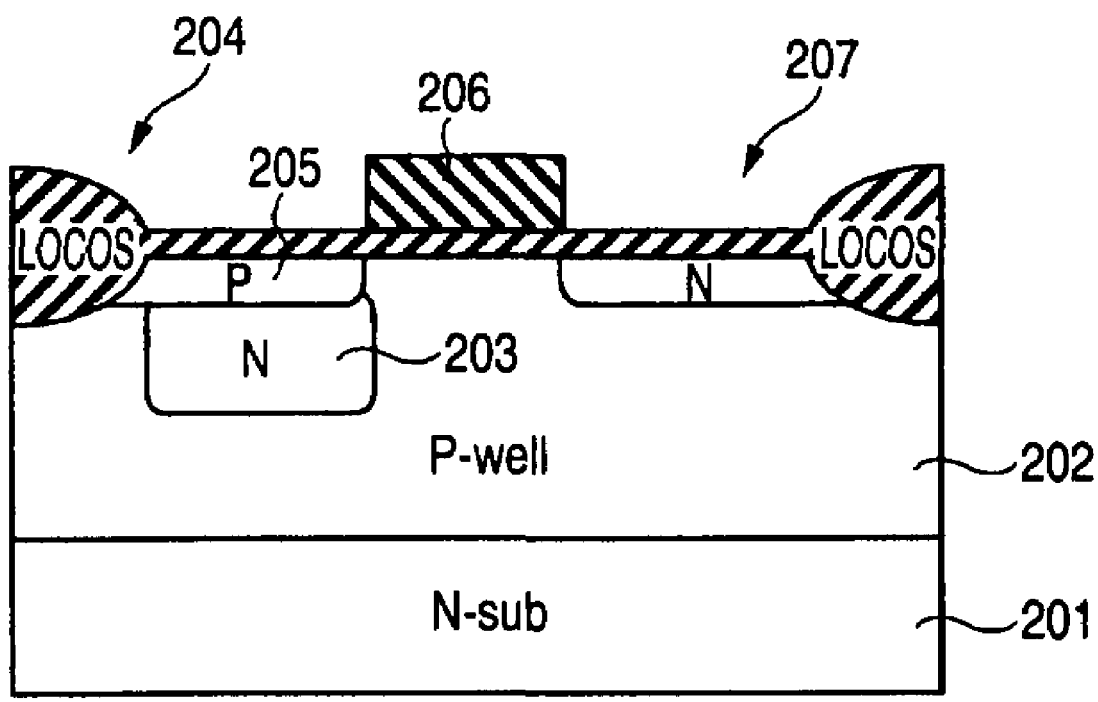
FIG. 13 shows a cross section depicting the pixel structure of the unit pixel.

For the optimum scheme of eliminating the back bias effect of the differential pair transistors 31 and 32, as described above, the source terminal and the back gate terminal are connected to each other (see FIG. 12). Of course in this connection state, the voltage of the source and the voltage of the back gate are the same voltage. A level shift circuit 41 of the AD converter device according to the embodiment is that the voltage of the source and the voltage of the back gate are the same in simulation.

More specifically, the level shift circuit 41 in the AD converter device according to the embodiment is formed of a source follower circuit in which three transistors 411, 412 and 413 are serially connected between the power source Vdd and the ground. The transistor 411 has the diode connecting configuration in which the gate terminal and the drain terminal are connected in common. In the transistor 412, the source terminal and the back gate terminal are connected to each other, the ramp wave reference voltage Vref is the gate input, and the back gate voltage VrefBG after level shift is the source output.

Here, the transistor 411 is made to have the same current density as that of an active load transistor 33 in a comparator 20 (or an active load transistor 34), the transistor 412 is made to have the same current density as that of the differential pair transistor 31, and the transistor 413 is made to have the same current density as that of the constant current source transistor 35.

With this configuration, for example, when the transistor 31 is compared with the transistor 412, they have the same gate voltage and the back gate voltage and have the same current density. Therefore, their source voltage is always the same. Since the source terminal and the back gate terminal are connected to each other in the transistor 412, the source voltage and the back gate voltage of the transistor 31 are made completely the same when the variation component of the transistor is ignored. For the bias condition, the condition is always the same as the state shown in FIG. 12, and the well is not actually isolated from every column, and thus the layout efficiency is not impaired.

In addition, here, it is described that "the same current density is provided", but only the density is the same, and the current values themselves are not the same. Since the level shift circuit 41 is demanded to have enough drive performance to drive the P well 52, it is necessary to set the output impedance rather low. On the other hand, since the comparator 20 is arranged in parallel by the number of columns, a large current cannot be carried through a single comparator and it is unnecessary to carry a large current therethrough. Therefore, in the level shift circuit 41, a plurality of transistors in the same layout form as that of the transistor for use in the comparator 20 is arranged. When attention is focused on a single transistor, it is desirable to arrange it with some contrivance so that the source follower part and the comparator part have the same current density.

As described above, the level shift circuit 41 which level shifts the ramp wave reference voltage Vref to generate the back gate voltage VrefBG is formed of the source follower circuit using the transistor 412 having the same current density as that of the differential pair transistors 31 and 32 of the comparator 20, whereby the source voltage and the back gate voltage of the differential pair transistors 31 and 32 are the same in simulation, and it can be operated as a transistor under the most efficient bias conditions.

Third Embodiment

Figure 7:
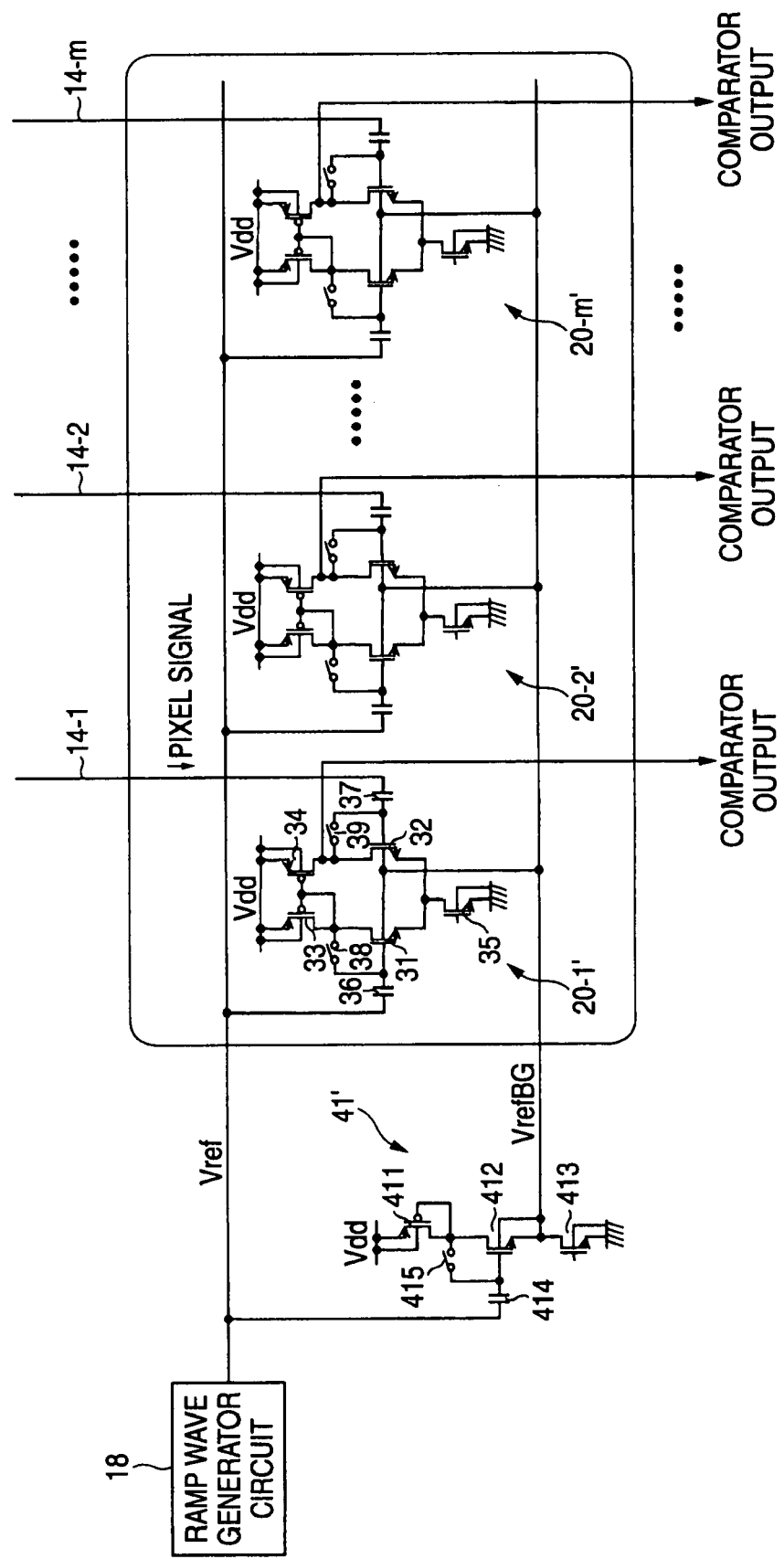
FIG. 7 shows a circuit diagram depicting the configuration of an AD converter device according to a third embodiment of the invention.

FIG. 7 shows a circuit diagram depicting an exemplary configuration of the portion of a comparator of an AD converter device according to a third embodiment. In the drawing, the same numerals and signs are assigned to the equivalent portions as those shown in FIG. 6.

In the AD converter device according to the embodiment, it is configured to have an offset removing circuit formed of capacitance devices 36 and 37 provided with a comparator 20' (20-1', 20-2', . . . , 20-m') in an input part, and switching devices 38 and 39 connected each between the gate terminal and the drain terminal of differential pair transistors 31 and 32.

As described above, in the column parallel AD converter device, it is necessary to perform AD conversion twice for the readout of the pixel signal at one time. In AD conversion at the first time, on the pixel side, the range that the value possibly takes is narrow since the reset level is outputted, and thus the conversion time can be set shorter. However, the reset level of the pixel also has great variations in every pixel, and the comparator itself has great variations in the input voltage offset. Thus, as in the cases of the first and second embodiments, in the structure in which the ramp wave reference voltage Vref and the pixel signal are directly inputted to the comparator 20, it is necessary to prepare the AD conversion time which can sufficiently absorb the amount of the variations.

When it is desired to shorten the conversion time at the first time as much as possible, it is efficient to absorb the offset in advance. In other words, in the state in which the pixel outputs the reset level and the ramp wave reference voltage Vref outputs the initial voltage, the switching devices 38 and 39 are turned on to charge the offset voltage of the pixel and the offset voltage of the comparator 20' in the capacitance devices 36 and 37, and the switching devices 38 and 39 are turned off to store the offset voltage. Therefore, the capacitance devices 36 and 37 completely absorb the offset voltage.

Such an advantage exerted by the offset removing circuit formed of the capacitance devices 36 and 37 and the switching devices 38 and 39 eliminates the concern for the offset voltage of each pixel or each row. Thus, the conversion time at the first time can be considerably shortened.

In the case of the comparator 20' having the offset removing circuit in the configuration above, the output DC level of the reference voltage Vref is different from the voltage actually applied to the gates of the differential pair transistors 31 and 32 of the comparator 20'. Thus, the level shift circuit 41 in the circuit configuration shown in FIG. 6 cannot be used as it is.

In order to solve the problem, the AD converter device according to the embodiment adopts such a configuration in which as shown in FIG. 7, a capacitance device 414 is connected to the gate terminal of a transistor 412 also in a level shift circuit 41', and a switching device 415 is connected between the gate terminal and the drain terminal.

In the level shift circuit 41', when the switching device 415 is turned on and off at the same timing as the comparator 20' is, the gate voltage similar to the comparator 20' is provided. When the variations in the transistor are ignored, the source voltage and the back gate voltage of the differential pair transistors 31 and 32 of the comparator 20' can be maintained completely at the same voltage on the same reason as that described in the second embodiment.

Furthermore, the scheme of canceling the offset introduced in the embodiment can almost completely absorb the threshold variations in the differential pair transistors 31 and 32 of the comparator 20', but it serves as no measures for the variation in the offset voltage caused by the back bias effect. Therefore, the scheme can exert the advantage in combination with the technical principles of an embodiment of the invention.

As described above, also in the AD converter device using the comparator 20' having the offset removing circuit in which the capacitance devices 36 and 37 are provided in the differential input part and the offset voltage itself is stored in the capacitance devices 36 and 37 to perform the offset cancellation operation, the level shift circuit 41' is allowed to perform the offset cancellation operation similar to that of the comparator 20' at the same timing, whereby the back bias effect does not have influence, and thus no AD conversion error occurs.

In addition, in the embodiments, the case is taken and described as an example in which the differential pair transistors 31 and 32 of the comparators 20 and 20' are all configured of N channel transistors. However, the identical discussion is held for the case in which they are configured of P channel transistors. Therefore, an embodiment of the invention is also effective for the case in which the differential pair transistors 31 and 32 are configured of P channel transistors.

In other words, also in the case in which they are configured of P channel transistors, when measures are taken by connecting the back gate (N well) to the source, it is necessary to provide the isolation area as well that exposes the P well in the front layer. The isolation area provided for every column extremely deteriorates the layout efficiency. In addition, the same discussion is held even in the case of using the wafer in the structure of a P type substrate. Therefore, an embodiment of the invention is also effective even in the case of using the wafer in the P type substrate structure.

In addition, in the embodiments, the case is taken and described as an example in which an embodiment of the invention is adapted to the AD converter device in which the ADC 16 including the comparator 20 is arranged by the number of pixel columns as matched with the pixel pitch with respect to the column signal lines 14-1, 14-2, ..., 14-m, that is, in the one on one correspondence. However, an embodiment of the invention is not limited to this exemplary application, which can be similarly adapted to an AD converter device in the configuration in which a single ADC 16 is arranged for a plurality of the column signal lines 14, and the ADC 16 is used in time division.

Moreover, in the embodiments, the case is taken and described as an example in which an embodiment of the invention is adapted to the AD converter device in which the pixel signal (analog signal) outputted from the unit pixel 11 through the column signal lines 14-1, 14-2 ... 14-m is AD converted in the column processing part 17. However, this is only an example. An embodiment of the invention can be similarly adapted to an AD converter device formed of a group of AD converters which are incorporated in a unit pixel 11 in which the pixel signal is AD converted in the pixel 11 to output to the column signal lines 14-1, 14-2, ..., 14-m.

Furthermore, in the embodiments, for the physical quantity distribution detecting unit, for example, an example is taken and described as the solid state imaging device, such as the CMOS image sensor, which detects the light quantity distribution of the image of light from a subject as the physical quantity distribution in units of pixels. However, an embodiment of the invention is not limited to this exemplary application, which can be similarly, generally adapted to solid state imaging devices mounted with a column parallel AD converter device in X-Y addressing mode such as a MOS image sensor. Moreover, not limited to the solid state imaging device, an embodiment of the invention can be generally adapted to physical quantity distribution detecting units which detect other physical quantities such as pressure and capacitance as a physical quantity in the unit of the unit sensor.

However, an embodiment of the invention is not limited to the application of the AD converter device mounted on the physical quantity distribution detecting unit, which can be adapted to an AD converter device itself in which a plurality of differential amplifier comparators (differential comparators) is arranged which compare the analog signal with the slope like reference voltage Vref wherein with reference to the comparison output of the plurality of the comparators, the analog signal is converted in the direction of the time base to measure the time period, whereby the digital signal is obtained.

Exemplary Application

The CMOS image sensor 10 mounted with the column parallel AD converter device according to the embodiments is suitable for use as an imaging device (image input unit) in an imaging apparatus including a video camera, a digital still camera, and a camera module for mobile appliances such as a cellular telephone.

Figure 8:
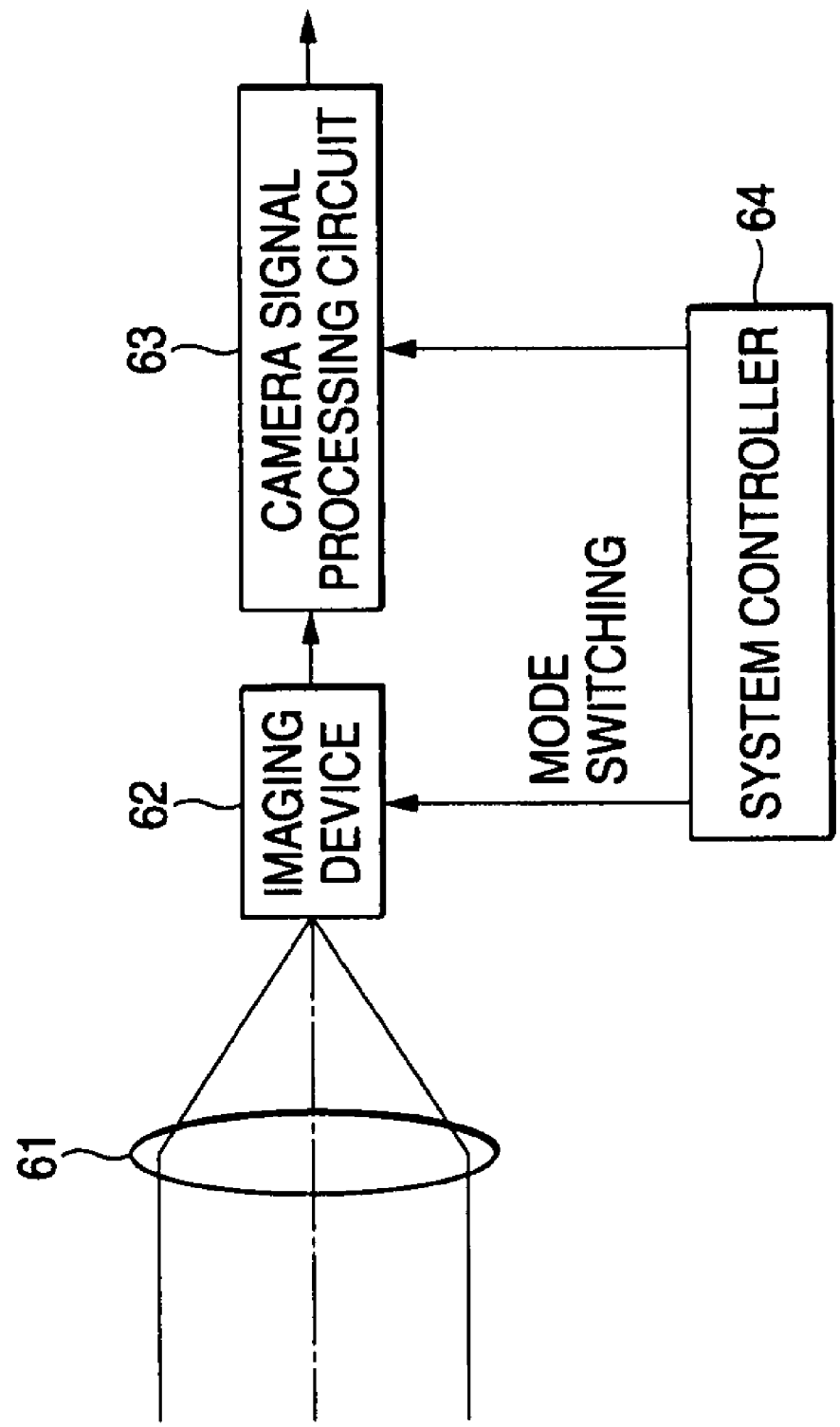
FIG. 8 shows a block diagram depicting an exemplary configuration of an imaging apparatus according to an embodiment of the invention.
Figure 9:
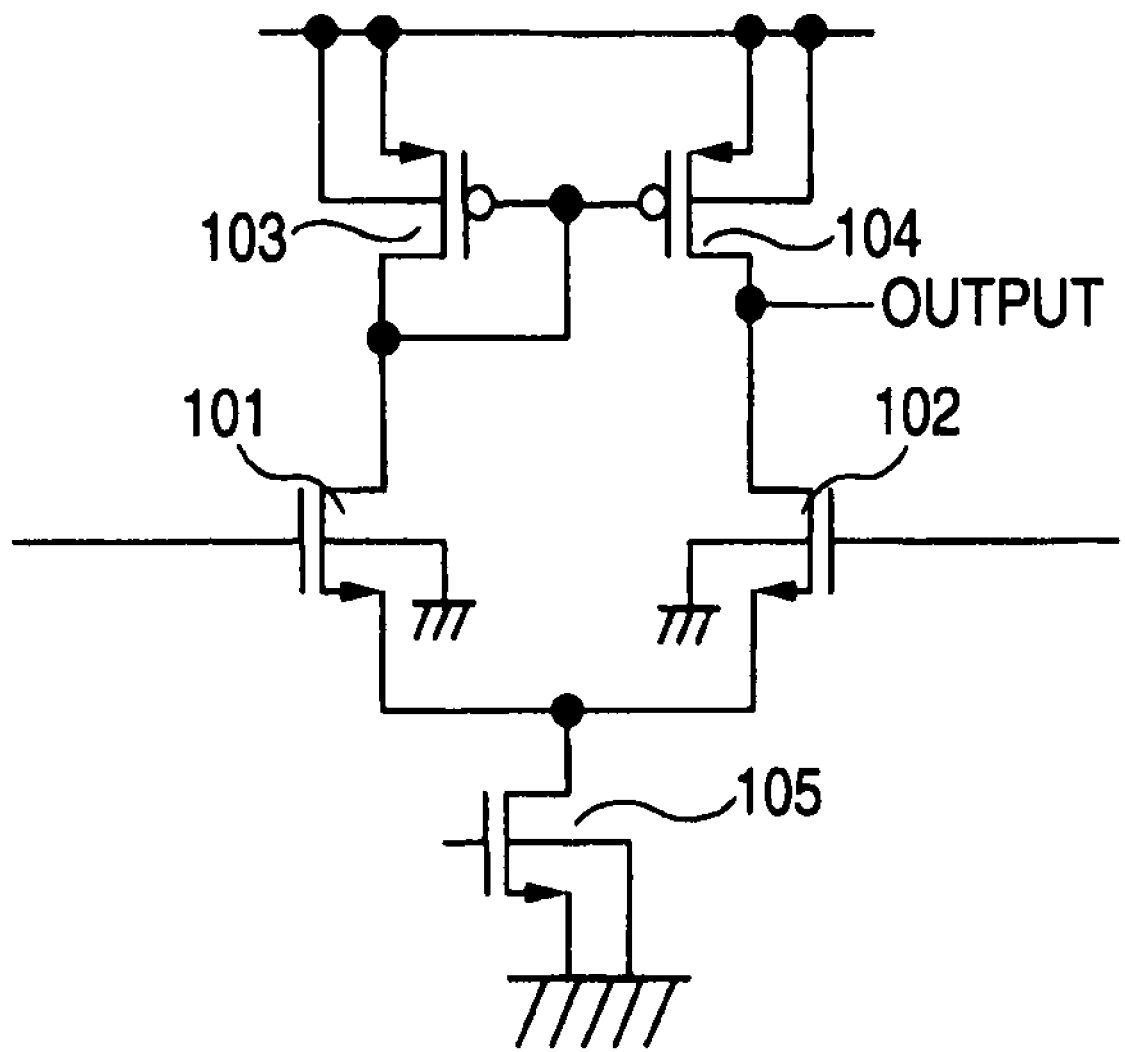
FIG. 9 shows a circuit diagram depicting a typical two-input comparator.
Figure 10:
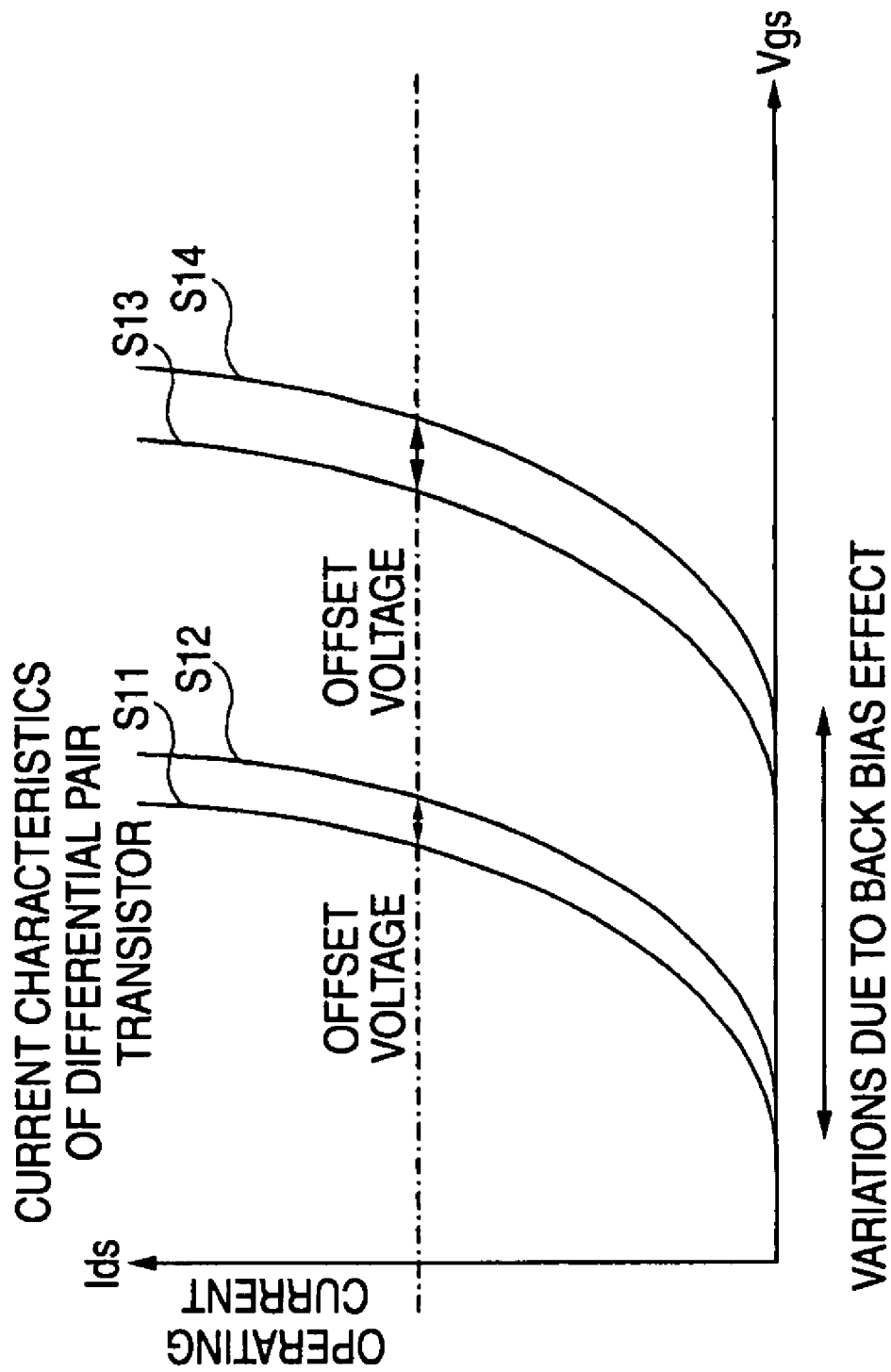
FIG. 10 shows a diagram depicting the current characteristics of a typical transistor.
Figure 11:
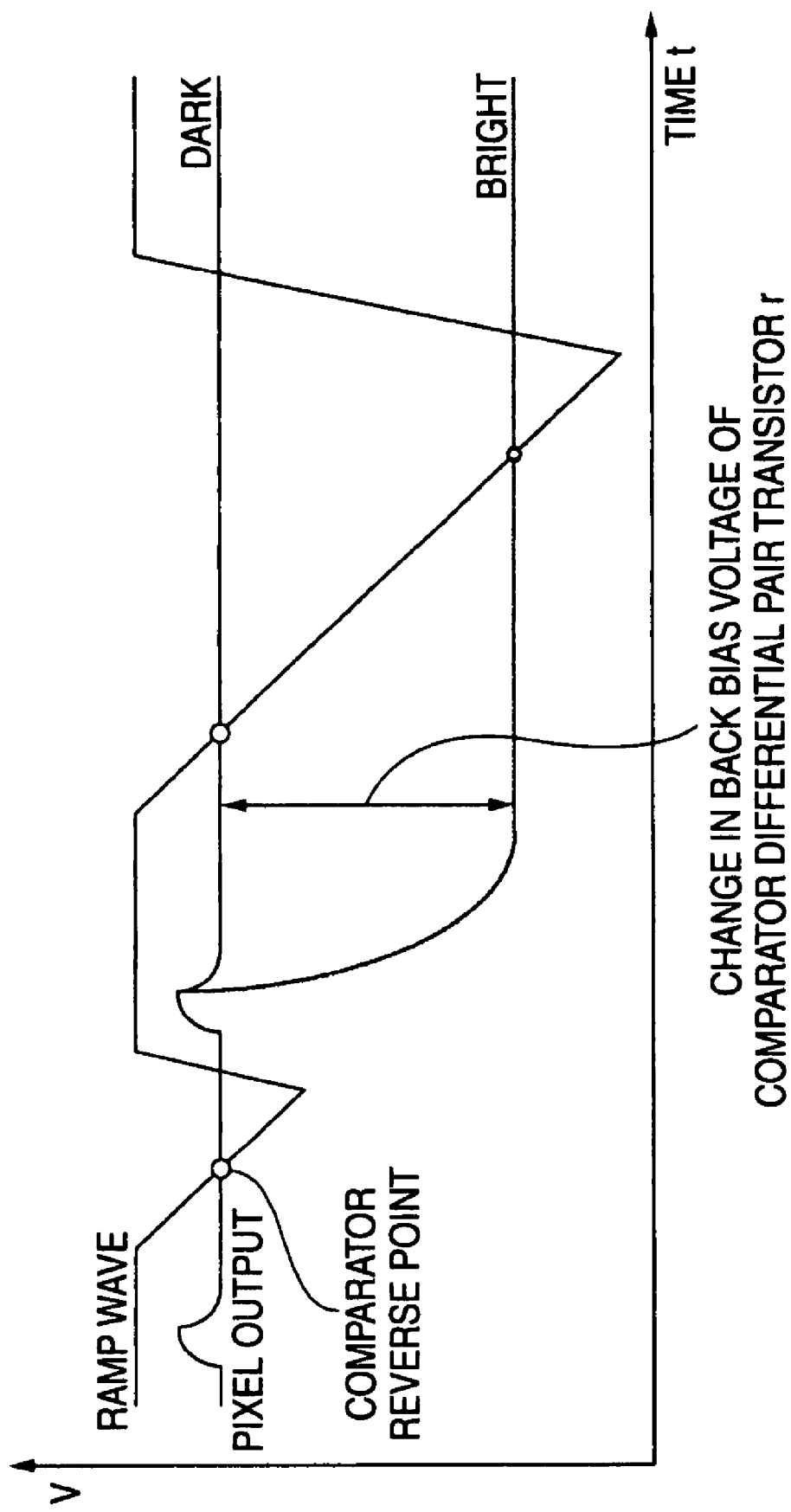
FIG. 11 shows a waveform diagram depicting the differences in the range that the signal possibly takes in AD conversions at the first time and the second time.

FIG. 8 shows a block diagram depicting an exemplary configuration of an imaging apparatus according to an embodiment of the invention. As shown in FIG. 8, the imaging apparatus according to this implementation is configured of an optical system including a lens 61, an imaging device 62, a camera signal processing circuit 63, a system controller 64, and so on.

The lens 61 forms an image of light from a subject on the imaging plane of the imaging device 62. The imaging device 62 outputs an image signal obtained by converting the image of light formed on the imaging plane by means of the lens 61 into the electric signal in units of pixels. For the imaging device 62, the CMOS image sensor 10 mounted with the column parallel AD converter device according to the embodiments is used.

The camera signal processing part 63 performs signal processing to the image signal outputted from the imaging device 62 in various ways. The system controller 64 controls the imaging device 62 and the camera signal processing part 63. Particularly, when the column parallel AD converter device of the imaging device 62 can perform the AD conversion operation corresponding to the operation modes: the normal frame rate mode in progressive scanning in which information in all the pixels is read, and the high speed frame rate mode in which the exposure time of the pixel is set to 1/M to multiple the frame rate by M in comparison with the normal frame rate mode, the switching control of the operation modes is performed in response to instructions from outside.

As described above, in the imaging apparatus including a video camera, a digital still camera, and a camera module for mobile appliances such as a cellular telephone, with the use of the CMOS image sensor mounted with the column parallel AD converter device according to the aforementioned embodiments as the imaging device 62, the back bias effect does not have influence while the comparator 20 configuring the AD converter device has a typical, simple differential amplifier structure. Therefore, vertical streaks caused by the back bias effect can be reduced to intend the improvement of image quality, and the high layout efficiency contributes to a reduction in size of the imaging apparatus.

It should be understood by those skilled in the art that various modifications, combinations, sub-combinations and alterations may occur depending on design requirements and other factors insofar as they are within the scope of the appended claims or the equivalents thereof.

What is claimed is:

1. An AD converter device in which a plurality of differential comparators are each operable to compare an applied analog signal with a corresponding slope reference signal, wherein a comparison output of each comparator is determined with reference to a measured time period, whereby a digital signal is obtained corresponding to each comparator, the AD converter device comprising:
voltage applying unit for applying a voltage signal having a same waveform shape as that of the corresponding reference signal to a back gate terminal of differential pair transistors of each differential comparator.

2. The AD converter device according to claim 1, wherein the voltage applying unit is operable to apply a voltage signal having the same waveform to the back gate terminal of the differential pair transistor at least during an AD conversion period.

3. The AD converter device according to claim 1, wherein the voltage applying unit is formed of a level shift circuit which level shifts the reference signal.

4. The AD converter device according to claim 3, wherein the level shift circuit is a source follower circuit using a transistor having a same current density as that of the differential pair transistors.

5. The AD converter device according to claim 4, wherein the differential comparator comprises an offset removing circuit having a capacitance device in each input part of the differential pair transistors in which its offset voltage is stored in the capacitance device to perform offset cancellation operation,
wherein the source follower circuit performs the same offset cancellation operation as that of the offset removing circuit at a same timing.

6. The AD converter device according to claim 1, wherein the differential pair transistors are formed to have a same well throughout the plurality of the differential comparators, and the well is isolated from other circuits.

7. A physical quantity distribution detecting unit comprising:
a sensor array part in which a unit sensor operable to detect a physical quantity is two dimensionally arranged in a matrix;
AD converting unit having a plurality of differential comparators each individually operable to compare a corresponding analog signal obtained by the unit sensor with a slope reference signal associated with the comparator, the AD converting unit operable to convert the analog signal based on a measured time period of a comparison output of each comparator, whereby a digital signal is obtained; and
voltage applying unit for applying a voltage signal having a same waveform as that of the comparator's reference signal to a back gate terminal of differential pair transistors of the differential comparator.

8. An imaging apparatus comprising:
a solid state imaging device in which a plurality of unit pixels are two dimensionally arranged in a matrix, each unit pixel including a photoelectric conversion element which converts incident light into an electric signal; and
an optical system operable to lead light from a subject onto an imaging plane of the solid state imaging device,
wherein the solid state imaging device includes:
AD converting means having a plurality of differential comparators operable to compare an analog signal obtained by corresponding ones of the pixels with a slope reference signal for the comparator, the AD converting unit operable to convert the analog signal applied to each comparator based on a time of a comparison output from the comparator, whereby a digital signal is obtained; and
voltage applying unit for applying a voltage signal having a same waveform shape as that of the reference signal to a back gate terminal of differential pair transistors of for each differential comparator.

9. An AD converter device in which a plurality of differential comparators are each operable to compare an applied analog signal with a corresponding slope reference signal, wherein each analog signal is converted based on a time of a comparison output from the comparator, whereby a digital signal is obtained, the AD converter device comprising:
a voltage applying module operable to apply a voltage signal having a same waveform shape as that of the reference signal for the comparator to a back gate terminal of differential pair transistors of the differential comparator.

10. A physical quantity distribution detecting unit comprising:

a sensor array part in which a plurality of unit sensors operable to detect a physical quantity are two dimensionally arranged in a matrix;

an AD converting module having a plurality of differential comparators, each operable to compare an applied analog signal obtained by an individual unit sensor with a slope reference signal, the AD converting module operable to convert analog signals into corresponding digital signals based on a time at which a comparison output from each comparator is provided; and a voltage applying module operable to apply a voltage signal having a same waveform shape as that of the reference signal to a back gate terminal of differential pair transistors for each differential comparator.

11. An imaging apparatus comprising:

a solid state imaging device in which a plurality of unit pixels are two dimensionally arranged in a matrix, each unit pixel including a photoelectric conversion element which converts incident light into an electric signal; and an optical system operable to lead light from a subject onto an imaging plane of the solid state imaging device, wherein the solid state imaging device includes:

an AD converting module having a plurality of differential comparators each operable to compare an applied analog signal obtained by a unit pixel with a slope reference signal, the AD converting module operable to convert analog signals based on a time of a comparison output of the plurality of the differential comparators, whereby digital signals are obtained; and a voltage applying module operable to apply a voltage signal having a same waveform shape as that of the corresponding reference signal to a back gate terminal of differential pair transistors of the differential comparator.

* * * * *